United States Patent
Hsieh

(10) Patent No.: US 10,976,378 B2
(45) Date of Patent: Apr. 13, 2021

(54) PORTABLE TEST DEVICE WITH AUTOMATIC ROBOTIC ARM

(71) Applicants: Inventec (Pudong) Technology Corp., Shanghai (CN); Inventec Corporation, Taipei (TW)

(72) Inventor: Chin-Lin Hsieh, Taipei (TW)

(73) Assignees: Inventec (Pudong) Technology Corp., Shanghai (CN); Inventec Corporation, Taipei (TW)

( * ) Notice: Subject to any disclaimer, the term of this patent is extended or adjusted under 35 U.S.C. 154(b) by 25 days.

(21) Appl. No.: 16/563,952

(22) Filed: Sep. 9, 2019

(65) Prior Publication Data

US 2021/0063462 A1 Mar. 4, 2021

(30) Foreign Application Priority Data

Aug. 28, 2019 (CN) .......................... 201910799241.X

(51) Int. Cl.
*G01R 31/00* (2006.01)
*G01R 31/69* (2020.01)
*G01R 1/04* (2006.01)

(52) U.S. Cl.
CPC ........... *G01R 31/69* (2020.01); *G01R 1/0416* (2013.01)

(58) Field of Classification Search
None
See application file for complete search history.

(56) References Cited

U.S. PATENT DOCUMENTS

| | | | | |
|---|---|---|---|---|
| 4,772,846 A | * | 9/1988 | Reeds ................ | G01R 31/2887 324/750.19 |
| 2001/0054892 A1 | * | 12/2001 | Takekoshi .......... | G01R 31/2887 324/750.19 |
| 2005/0237081 A1 | * | 10/2005 | Chidambaram ... | G01R 31/2889 324/750.22 |
| 2013/0220023 A1 | * | 8/2013 | Zhang ..................... | G01N 3/38 73/808 |

* cited by examiner

*Primary Examiner* — Jas A Sanghera
(74) *Attorney, Agent, or Firm* — Winston Hsu

(57) ABSTRACT

A portable test device with automatic robotic arm is provided to use a micro step motor as the power source for the reciprocating movement of the robotic arm. The dual adjustment slots design of the intermediate plate enables quick adjustment of the angle and height of the robotic arm. The intermediate plate is further mounted to a precision guide for precise operation of the robotic arm.

6 Claims, 5 Drawing Sheets

PORTABLE TEST DEVICE WITH AUTOMATIC ROBOTIC ARM

BACKGROUND OF THE INVENTION

1. Field of the Invention

The invention relates to a portable test device, more particularly, to a small-sized portable automatic robotic arm test device.

2. Description of the Prior Art

Electronic devices like servers, laptop computers, desktop computers, or mobile phones, should be tested for reliability and functionality after the assembling stage. Robotic arm clamping related test connector is commonly used for such test. In the process of testing, air-pressured equipment drives the robotic arm to move forwards and backwards, whereby the test connector can also be plugged and pulled repeatedly on the I/O connector of the tested electronic device.

Since the current test devices with robotic arm are mostly driven by large air-pressured equipment, portability is never a case for modern test devices. Additionally, the variety of products to be tested consumes a great amount of time adjusting the height and angle of the test connector and setting the software configuration for the plug and pull stroke each time before the connection port of another product can be readily tested, which indicates the need of lots of human cost.

SUMMARY OF THE INVENTION

Hence, an easily adjustable portable test device with automatic robotic arm is provided in the invention to solve the above problem.

According to an embodiment of the invention, a portable test device with automatic robotic arm includes a base, a driving member disposed on the base, an intermediate plate, and a fixture member. The intermediate plate is connected to the driving member and can be moved by the driving member backwards and forwards along a first direction. The fixture member holds a test connector and is locked on the intermediate plate with height and angle adjustability.

According to the embodiment of the invention, the portable test device further includes a control circuit board disposed on the base. The control circuit board is connected to the driving member and controls the driving member to move the intermediate plate backwards and forwards.

According to the embodiment of the invention, the portable test device further includes a precision guide disposed on the base. The intermediate plate is further connected to the precision guide utilized for maintaining precised movement of the intermediate plate when the driving member moves the intermediate plate backwards and forwards along the first direction.

According to the embodiment of the invention, the driving member is a micro step motor.

According to the embodiment of the invention, the intermediate plate includes a first adjusting slot and a second adjusting slot parallel with each other. The fixture member is locked respectively on the first adjusting slot and the second adjusting slot via two locking points.

According to the embodiment of the invention, the first adjusting slot and the second adjusting slot have orientation along a second direction where the second direction is perpendicular to the first direction.

According to the embodiment of the invention, the portable test device is utilized for plug and pull reliability test for connection ports of electronic devices.

The portable test device provided by the embodiments of the invention has the advantages of easy detachability and adoption of micro step motor as the power source to drive the fixture member, and hence possess portability originated from lightweight and miniaturization. The use of dual adjusting slots facilitates fast micro adjustment of the angle and height of the fixture member, accompanied by software-based plug and pull stroke control and precision control of the robotic arm using precision guide.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. In the following discussion and in the claims, the terms "include" and "comprise" are used in an open-ended fashion. Also, the term "couple" is intended to mean either an indirect or direct electrical/mechanical connection. Thus, if a first device is coupled to a second device, that connection may be through a direct electrical/mechanical connection, or through an indirect electrical/mechanical connection via other devices and connections.

Figure 1:
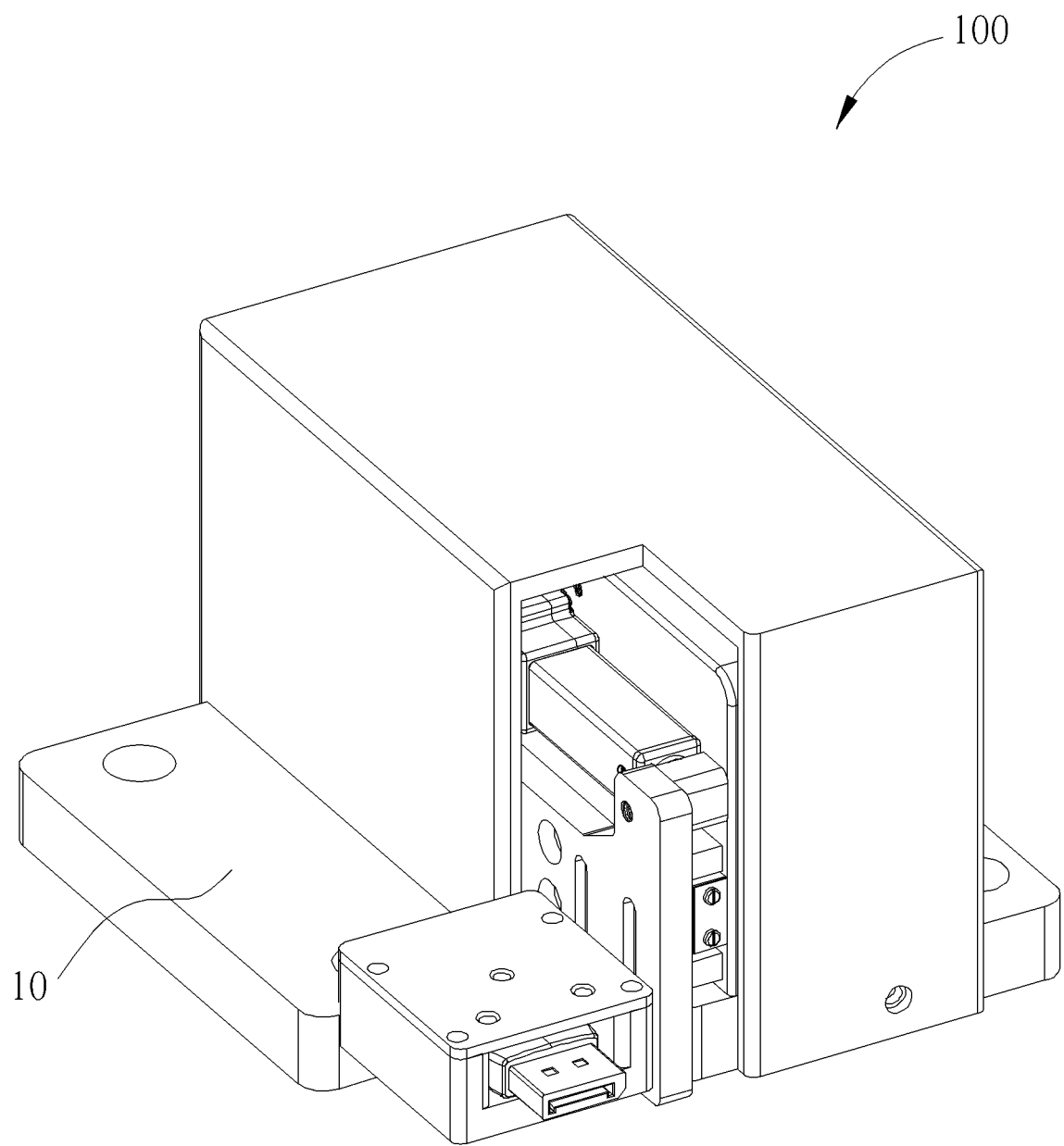
FIG. 1 illustrates an embodiment of a portable test device with automatic robotic arm according to the invention.

Please refer to FIG. 1. FIG. 1 illustrates an embodiment of a portable test device with automatic robotic arm according to the invention. The portable test device 100 is adapted for reliability test for connection ports of an electronic device where an automatic robotic arm is disposed on the base 10, driven by a step motor, such that light weight and portable size is possible for the portable test device 100.

Figure 2:
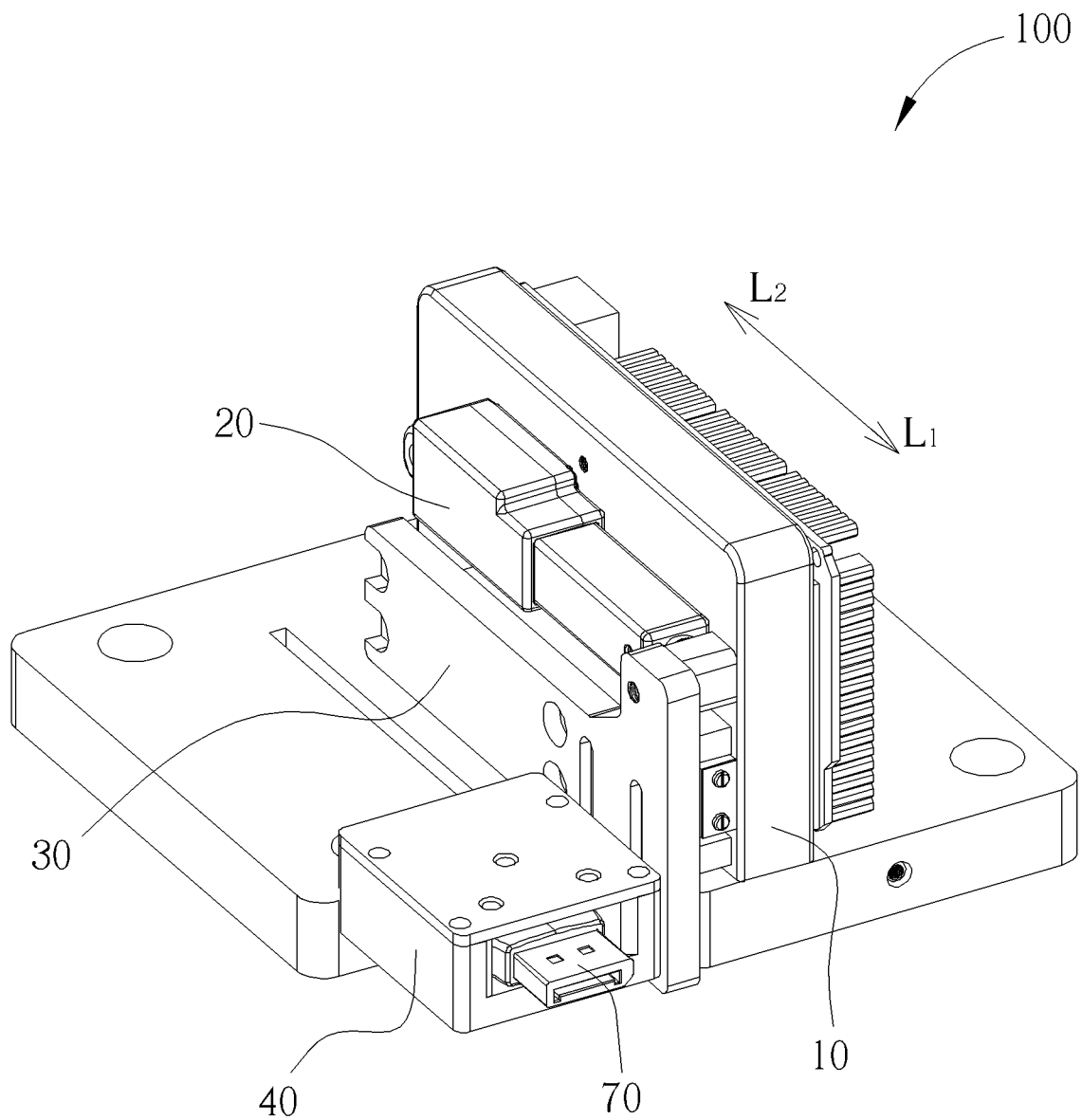
FIG. 2 and FIG. 3 are illustrations of the portable test device 100 from FIG. 1 in different perspectives.
Figure 3:
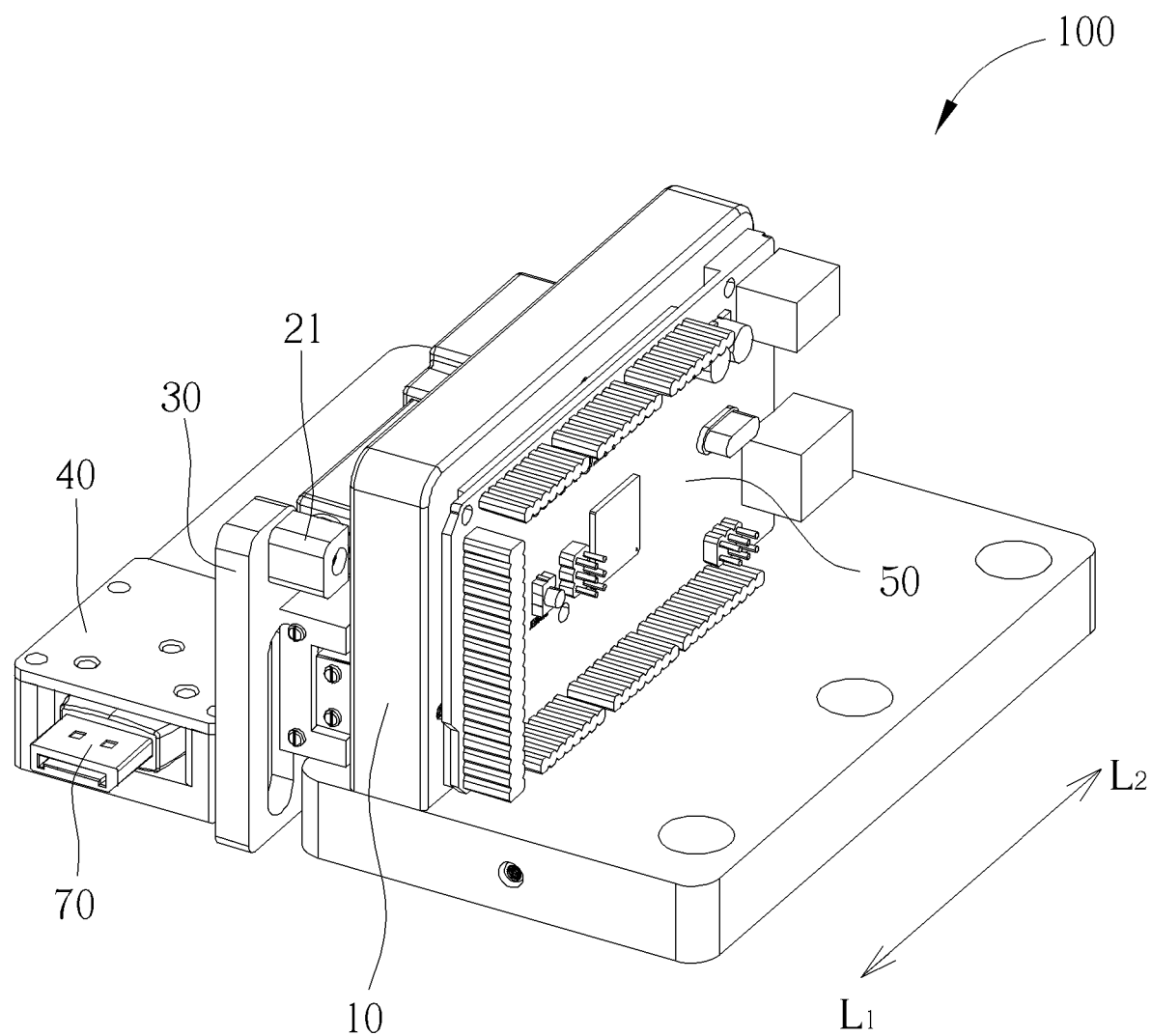
Figure 4:
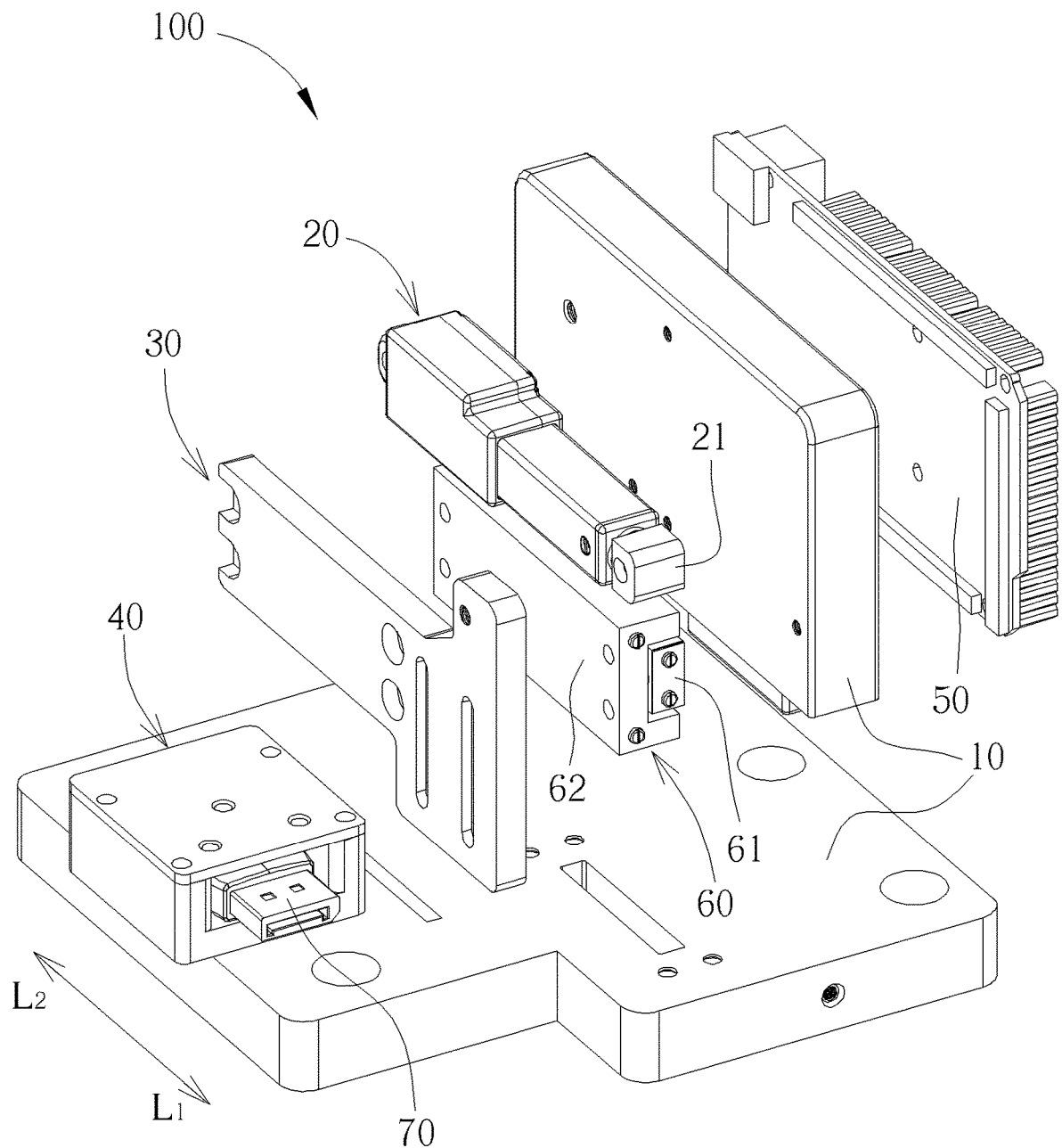
FIG. 4 is an illustration showing exploded view of the components of the portable test device 100.

Please refer to FIG. 2 to FIG. 4. FIG. 2 and FIG. 3 are illustrations of the portable test device 100 from FIG. 1 in different perspectives. FIG. 4 is an illustration showing exploded view of the components of the portable test device 100. In one embodiment, the portable test device 100 includes a base 10, a driving member 20, an intermediate plate 30, a fixture member 40, a control circuit board 50, and a precision guide 60. The driving member 20 is preferably, but not limited to, a micro step motor for portability purpose, which is disposed on the base 10. The intermediate plate 30 is connected and locked to the driving member 20, for example, to an end point 21 of the driving member 20, and moved by the driving member 20 backwards and forwards along direction L1L2 (or a first direction). The control circuit board 50 is also disposed on the base 10 and controls the driving member 20 to execute instructions of a mechanical motor, controlling the driving member 20 to move the intermediate plate 30 back and forth for example.

As a clamping apparatus, the fixture member 40 is used for holding a test connector 70 and is locked on the intermediate plate 30 in a height and angle adjustable way. The fixture member 40 moves with the intermediate plate 30 in a way that the test connector 70 goes over the plug and pull to a connection port of the electronic device as the intermediate plate 30 is moved by the driving member 20 for the test of reliability of the connection port.

Please refer to FIG. 4. To maintain the moving precision as the driving member 20 moves the intermediate plate 30 backwards and forwards, the intermediate plate 30 is further connected to the precision guide 60, which is also disposed on the base 10. In one embodiment, the precision guide 60 may include a stable part 61 and a sliding part 62. The stable part 61 is fixed on the base 10 and the sliding part 62 is capable of precised sliding on the stable part 61. The intermediate plate 30 is locked to the sliding part 62 of the precision guide 60.

Figure 5:
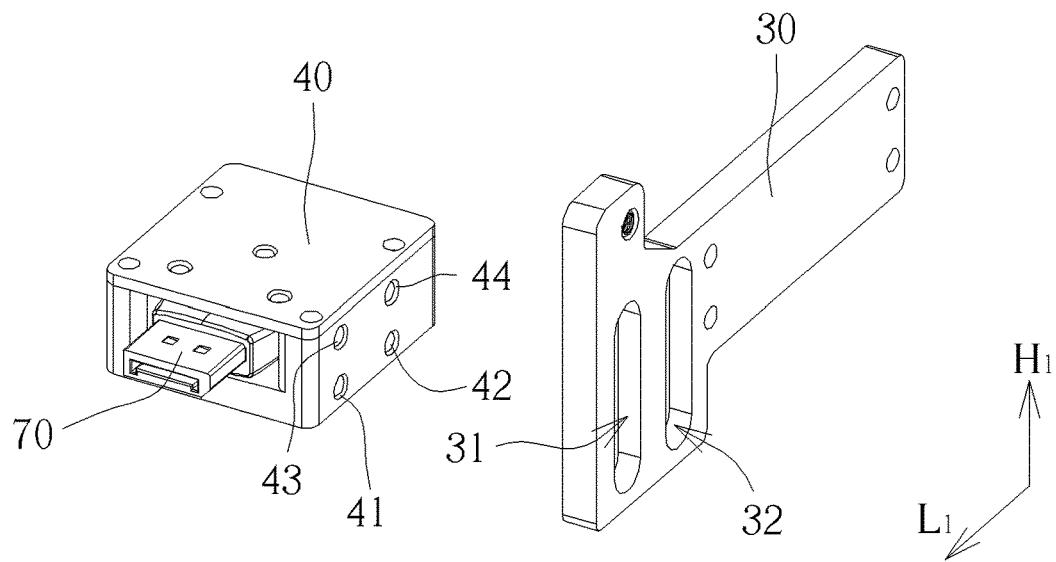
FIG. 5 illustrates an embodiment of the intermediate plate and the fixture member of the portable test device.

Please refer to FIG. 5. FIG. 5 illustrates an embodiment of the intermediate plate and the fixture member of the portable test device. As stated earlier, the fixture member 40 is locked on the intermediate plate 30 in a height and angle adjustable way. As in the embodiment of FIG. 5 for example, the intermediate plate 30 has a first adjusting slot 31 and a second adjusting slot 32 that are parallel with each other, where the fixture member 40 is locked respectively on the first adjusting slot 31 and the second adjusting slot 32 via two locking points 41, 42. A second set of locking points 43, 44 may also be used for locking the fixture member 40 on the first adjusting slot 31 and the second adjusting slot 32 for stability enhancement with regards to mounting the fixture member 40 on the intermediate plate 30. The first adjusting slot 31 and the second adjusting slot 32 are two parallel long slots extending along direction H1 (a second direction), which in this embodiment is perpendicular to the direction L1L2 along which the driving member 20 moves backwards and forwards.

To make adjustment of the fixture member 40 on the intermediate plate 30, the angle of the fixture member 40 along with the test connector 70 can be adjusted either by holding the locking point 41 on the first adjusting slot 31 while moving up and down the position of the locking point 42 on the second adjusting slot 32 or by holding the locking point 42 on the second adjusting slot 32 while moving up and down the position of the locking point 41 on the first adjusting slot 31.

The height of the fixture member 40 along with the test connector 70 can be adjusted by moving up and down the position of both the locking point 41 on the first adjusting slot 31 and the locking point 42 on the second adjusting slot 32. In most cases, both the height and angle of the fixture member 40 and the text connector 70 can be adjusted at the same time. With the dual slot adjustment provided by the intermediate plate 30, fast and micro adjustment of the height and angle of the fixture member 40 (robotic arm) is achieved.

Figure 6:
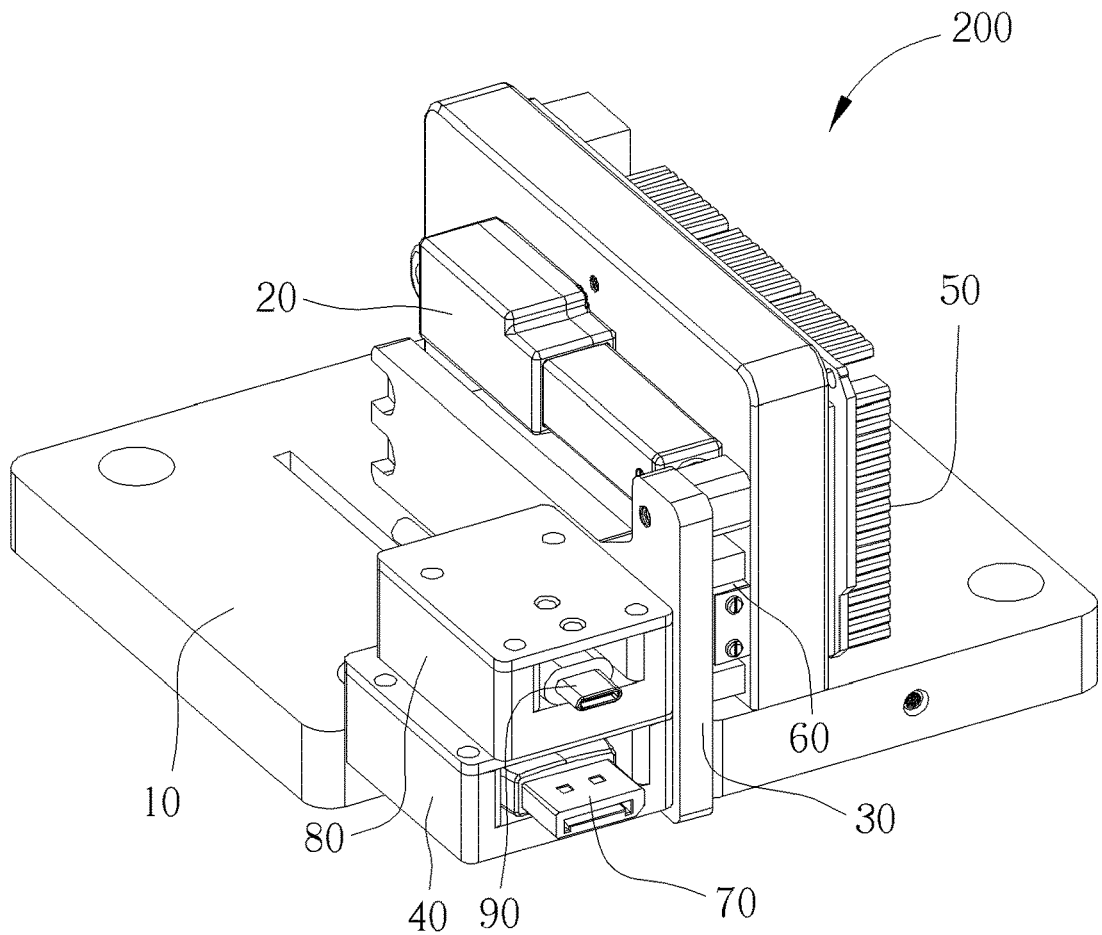
FIG. 6 shows a portable test device including two fixture members, each locked on the intermediate plate in a height and angle adjustable way.

In addition to the above embodiment, reliability test for two or more connection ports can be covered by the invention when it comes to any tested device with specific port configuration. For example, another embodiment in FIG. 6 shows a portable test device 200 including two fixture members 40, 80, each locked on the intermediate plate 30 in a height and angle adjustable way. The fixture member 40 is adapted to, but not limited to, hold a test connector 70 as for HDMI port or other possible form and the fixture member 80 is adapted to, but not limited to, hold a test connector 90 as for USB Type-C or other possible form. The respective height and angle of the test connectors 70, 90 can be adjusted depending on the tested devices.

The portable test device with automatic robotic arm provided in the embodiment of the invention uses the micro step motor as the power source for the reciprocating movement of the robotic arm so that miniaturization and portability of the test device can be realized. The dual adjustment slots design of the intermediate plate enables quick adjustment of the angle and height of the robotic arm whereas the plug and pull stroke of the test connector can be tuned with software via the control circuit board. The intermediate plate is further mounted to the precision guide for precise operation of the robotic arm.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A portable test device with automatic robotic arm, comprising:
    a base;
    a driving member disposed on the base;
    an intermediate plate connected to the driving member and moved by the driving member backwards and forwards along a first direction, the intermediate plate comprising a first adjusting slot and a second adjusting slot parallel with each other; and
    a fixture member for holding a test connector, the fixture member locked respectively on the first adjusting slot and the second adjusting slot of the intermediate plate via two locking points with height and angle adjustability.

2. The portable test device of claim 1, further comprising a control circuit board disposed on the base, the control circuit board connected to the driving member and controlling the driving member to move the intermediate plate backwards and forwards.

3. The portable test device of claim 1, further comprising a precision guide disposed on the base, the intermediate plate further connected to the precision guide utilized for maintaining movement of the intermediate plate when the driving member moves the intermediate plate backwards and forwards along the first direction.

4. The portable test device of claim 1, wherein the driving member is a micro step motor.

5. The portable test device of claim 1, wherein the first adjusting slot and the second adjusting slot have orientation along a second direction where the second direction is perpendicular to the first direction.

6. The portable test device of claim 1, wherein the portable test device is utilized for plug and pull reliability test for connection ports of electronic devices.

* * * * *